(12) United States Patent
Lin

(10) Patent No.: US 10,763,876 B2
(45) Date of Patent: Sep. 1, 2020

(54) APPARATUS, CIRCUITS AND METHODS FOR CALIBRATING A TIME TO DIGITAL CONVERTER

(71) Applicant: Taiwan Semiconductor Manufacturing Co., Ltd., Hsin-Chu (TW)

(72) Inventor: Yu-Tso Lin, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/575,267

(22) Filed: Sep. 18, 2019

(65) Prior Publication Data

US 2020/0136632 A1 Apr. 30, 2020

Related U.S. Application Data

(60) Provisional application No. 62/751,937, filed on Oct. 29, 2018.

(51) Int. Cl.
*H03M 1/10* (2006.01)
*G04F 10/00* (2006.01)

(52) U.S. Cl.
CPC ........ *H03M 1/1009* (2013.01); *G04F 10/005* (2013.01)

(58) Field of Classification Search
CPC .......................... H03M 1/1009; G04F 10/005
USPC ................................. 341/115–155; 327/278
See application file for complete search history.

(56) References Cited

U.S. PATENT DOCUMENTS

| | | | |
|---|---|---|---|
| 8,090,068 B2* | 1/2012 | Sun | H03L 7/085 375/376 |
| 8,390,349 B1* | 3/2013 | Ravi | G04F 10/005 327/147 |
| 8,447,548 B2* | 5/2013 | McKay | G01R 31/002 702/66 |
| 8,471,736 B1* | 6/2013 | Booth | G04F 10/005 327/105 |
| 8,970,420 B2* | 3/2015 | Henzler | H03M 1/50 324/76.11 |
| 2004/0135606 A1* | 7/2004 | Takahashi | G01R 29/26 327/170 |
| 2004/0239396 A1* | 12/2004 | Hoetzel | G01S 13/00 327/278 |
| 2008/0157839 A1* | 7/2008 | Staszewski | H03L 7/091 327/161 |
| 2010/0244971 A1* | 9/2010 | Wang | G04F 10/005 331/1 A |
| 2012/0001785 A1* | 1/2012 | Nagata | G01R 31/31922 341/152 |

(Continued)

*Primary Examiner* — Lam T Mai (74) *Attorney, Agent, or Firm* — Duane Morris LLP (57) ABSTRACT

Apparatus, circuits and methods for calibrating time to digital converters (TDCs) are disclosed herein. In some embodiments, a circuit for calibrating a TDC is disclosed. The circuit includes a multi-bit delay circuit, a counter, and a register. The multi-bit delay circuit is configured for delaying a clock signal by a total delay time. The counter is configured for counting rising edges of the clock signal within the total delay time to generate a counted output. The register is configured for controlling the total delay time of the multi-bit delay circuit based on the counted output.

20 Claims, 5 Drawing Sheets

(56) References Cited

U.S. PATENT DOCUMENTS

| | | | |
|---|---|---|---|
| 2013/0187800 A1* | 7/2013 | Wang | G04F 10/005 |
| | | | 341/118 |
| 2014/0333358 A1* | 11/2014 | Kim | H03L 7/1974 |
| | | | 327/159 |
| 2017/0146672 A1* | 5/2017 | Chen | G01T 1/2018 |
| 2017/0293265 A1* | 10/2017 | Salle | G04F 10/005 |
| 2018/0076821 A1* | 3/2018 | Loke | H03M 1/183 |
| 2018/0138911 A1* | 5/2018 | Kuo | H03L 7/0992 |

* cited by examiner

APPARATUS, CIRCUITS AND METHODS FOR CALIBRATING A TIME TO DIGITAL CONVERTER

RELATED APPLICATIONS

This application claims priority to provisional application number 62/751,937 entitled "CIRCUITS AND CALIBRATION METHODS FOR A TIME TO DIGITAL CONVERTER," and filed on Oct. 29, 2018, the entirety of which is incorporated by reference herein.

BACKGROUND

A time to digital converter (TDC) is a circuit block that converts time information to digital signals. It has two major input clock signals, a digitally controlled oscillator (DCO) clock signal and a reference clock signal. A DCO clock signal with high speed of several GHz may pass multi-stages of delay cells.

For a conventional TDC with coarse or fine resolution or resolution amplified by a time amplifier, the finest delay resolution is worse at low voltage, low temperature, or slow corner due to degraded inverter performance. Because a total delay time across all delay cells should be larger than one DCO period to have correct timing conversion, a maximum period of DCO clock is selected. As such, the finest delay resolution is fixed and limited by the maximum period of DCO clock, where the delay time is still much larger than one DCO period as DCO frequency increases several times.

The information disclosed in this Background section is intended only to provide context for various embodiments of the invention described below and, therefore, this Background section may include information that is not necessarily prior art information (i.e., information that is already known to a person of ordinary skill in the art). Thus, work of the presently named inventors, to the extent the work is described in this background section, as well as aspects of the description that may not otherwise qualify as prior art at the time of filing, are neither expressly nor impliedly admitted as prior art against the present disclosure.

BRIEF DESCRIPTION OF THE DRAWINGS

Various exemplary embodiments of the present disclosure are described in detail below with reference to the following Figures. The drawings are provided for purposes of illustration only and merely depict exemplary embodiments of the present disclosure to facilitate the reader's understanding of the present disclosure. Therefore, the drawings should not be considered limiting of the breadth, scope, or applicability of the present disclosure. It should be noted that for clarity and ease of illustration these drawings are not necessarily drawn to scale.

DETAIL DESCRIPTION

Various exemplary embodiments of the present disclosure are described below with reference to the accompanying figures to enable a person of ordinary skill in the art to make and use the present disclosure. As would be apparent to those of ordinary skill in the art, after reading the present disclosure, various changes or modifications to the examples described herein can be made without departing from the scope of the present disclosure. Thus, the present disclosure is not limited to the exemplary embodiments and applications described and illustrated herein. Additionally, the specific order and/or hierarchy of steps in the methods disclosed herein are merely exemplary approaches. Based upon design preferences, the specific order or hierarchy of steps of the disclosed methods or processes can be re-arranged while remaining within the scope of the present disclosure. Thus, those of ordinary skill in the art will understand that the methods and techniques disclosed herein present various steps or acts in a sample order, and the present disclosure is not limited to the specific order or hierarchy presented unless expressly stated otherwise.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

The present disclosure provides circuits and methods for calibrating a TDC to enable the TDC to achieve delay resolution optimization and a total delay time covering one DCO period. In one embodiment, a disclosed TDC circuit comprises multi-bit delay cells, counters, registers, and decision logic circuits. The multi-bit delay cells have many stages of time delay resolution for dynamically adjusting the time resolution as a TDC condition like DCO frequency or process, voltage and temperature (PVT) changes. The delay resolution is highly and directly related to quantization noise. The disclosed circuits and methods can improve noise performance, especially in all digital synthesizers since closed-loop in-band noise is dominant by the TDC quantization noise.

In one embodiment, a TDC having 128-stage delay cells is initialized with a minimum delay resolution. After a pulse signal passes the 128 delay cells, a total delay time is measured from first to last delay cell outputs. If the total delay time is not larger than one DCO period, then delay cell with larger delay time is selected. If the total delay time is larger than one DCO period, the delay resolution setting is fixed and the TDC is returned to normal TDC function. The disclosed circuit may perform the TDC calibration once initially or act as a resolution monitoring circuit to detect a change of a TDC condition like input frequency or PVT changes. Then, the delay resolution is optimized, e.g. minimized and covering at least one DCO period, and insensitive to PVT and input frequencies.

Figure 1A:
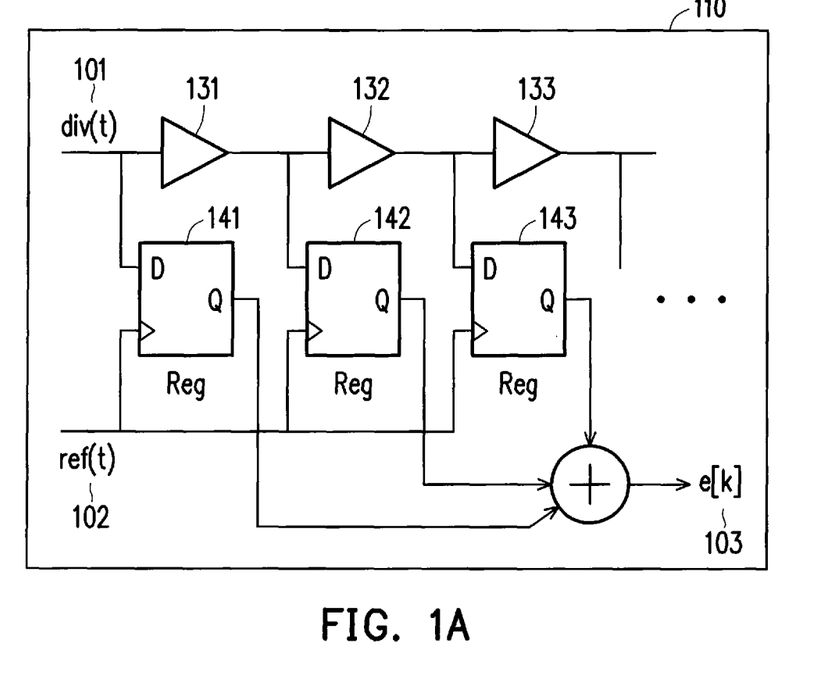
FIG. 1A illustrates a block diagram of an exemplary time-to-digital converter (TDC), in accordance with some embodiments of the present disclosure.

FIG. 1A illustrates a block diagram of an exemplary time-to-digital converter (TDC) 110, in accordance with some embodiments of the present disclosure. As shown in FIG. 1A, the TDC 110 includes a plurality of delay cells 131, 132, 133, and a plurality of registers 141, 142, 143. A TDC is configured for converting time information into digital outputs. In particular, the TDC 110 converts a clock signal div(t) 101 into a digital output e[k] 103, e.g. by determining a phase difference between the clock signal div(t) 101 and a reference signal ref(t) 102.

The plurality of delay cells 131, 132, 133 are connected in series to one another. A time resolution step is related to the plurality of delay cells 131, 132, 133. A total delay time of the multi-bit delay circuit is variable according to active and inactive delay cells of the plurality of delay cells based on a register value of the register.

As shown in FIG. 1A, the TDC 110 has two major input clock signals, the clock signal div(t) 101 and the reference clock signal ref(t) 102. The clock signal div(t) 101 may be a DCO clock signal that is generated by a DCO clock with high speed of several GHz. The clock signal div(t) 101 passes through at least one of the plurality of delay cells 131, 132, 133 of the TDC 110, i.e. passing multi-stages of delay cells in FIG. 1A. A fine resolution time is the inverter delay of each delay cell.

The reference clock signal ref(t) 102 in this example operates at a much slower frequency, e.g. a few MHz. The reference clock signal ref(t) 102 samples all delay cell outputs, through the plurality of registers 141, 142, 143. The plurality of registers 141, 142, 143 in this example output timing information as coded digital words e[k] 103.

Figure 1B:
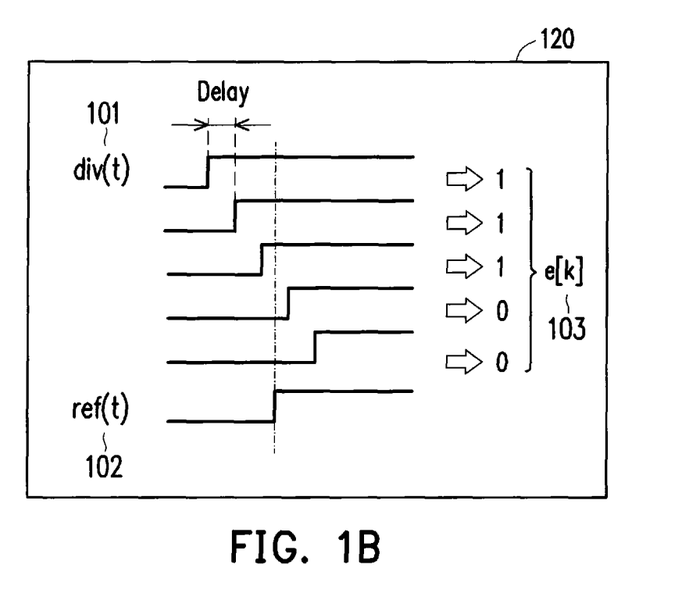
FIG. 1B illustrates waveforms of signals in the TDC shown in FIG. 1A, in accordance with some embodiments of the present disclosure.

FIG. 1B illustrates waveforms 120 of signals in the TDC 110 shown in FIG. 1A, in accordance with some embodiments of the present disclosure. As shown in FIG. 1B, the clock signal div(t) 101 has multiple versions of waveforms with different delay times. With respect to the reference clock signal ref(t) 102, the clock signal div(t) 101 has some waveform versions with rising edges before the rising edge of the reference clock signal ref(t) 102 and other waveform versions with rising edges after the rising edge of the reference clock signal ref(t) 102. In this example, among the five waveform versions shown in FIG. 1B, the first three waveform versions have rising edges before the rising edge of the reference clock signal ref(t) 102 (represented by bit 1), and the last two waveform versions have rising edges after the rising edge of the reference clock signal ref(t) 102 (represented by bit 0). As such, the digital output e[k] 103 in this example shown in FIG. 1B has a value of "11100."

Figure 2:
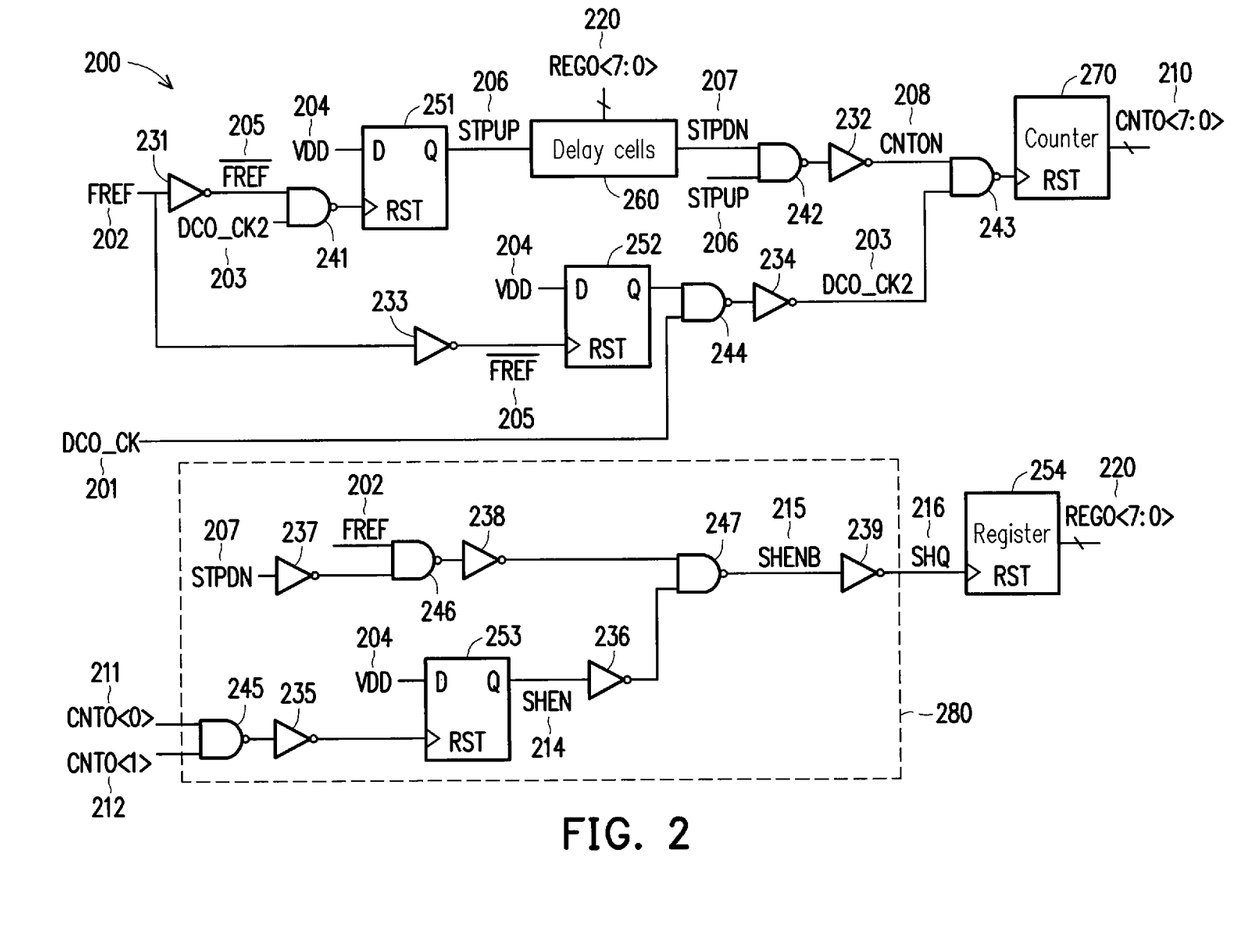
FIG. 2 illustrates a block diagram of an exemplary circuit for calibrating a TDC, in accordance with some embodiments of the present disclosure.

FIG. 2 illustrates a block diagram of an exemplary circuit 200 for calibrating a TDC, e.g. the TDC 110 in FIG. 1A, in accordance with some embodiments of the present disclosure. The TDC to be calibrated is configured for converting a clock signal into a digital output. As shown in FIG. 2, the circuit 200 in this example includes a multi-bit delay circuit 260 configured for delaying the clock signal by a total delay time. The multi-bit delay circuit 260 may be part of the TDC to be calibrated. In one embodiment, the multi-bit delay circuit 260 in FIG. 2 corresponds to the delay cells 131, 132, 133 in FIG. 1A. That is, the circuit 200 in FIG. 2 may be added to a TDC circuit and connected to delay cells of the TDC, e.g. the TDC 110 in FIG. 1A, for controlling the delay resolution and the total delay time of the delay cells of the TDC.

The circuit 200 in this example further includes a counter 270 configured for comparing the total delay time with one period of the clock signal to generate a comparison output; and a register 254 configured for controlling the total delay time of the multi-bit delay circuit 260 based on the comparison output. In one embodiment, the counter 270 is configured for counting rising edges of the clock signal within the total delay time to generate a counted output; and the register 254 is configured for controlling the total delay time of the multi-bit delay circuit 260 based on the counted output.

In one embodiment, the multi-bit delay circuit 260 comprises a plurality of delay cells connected in series to one another, like the plurality of delay cells 131, 132, 133. The total delay time of the multi-bit delay circuit 260 can be variable according to active and inactive delay cells of the plurality of delay cells based on a register value 220 of the register 254. As such, the multi-bit delay cells have many steps or stages of time resolution. In one example, a switch is coupled to the plurality of delay cells and configured for selecting at least one of the plurality of delay cells to activate based on the register value 220 of the register 254. In another example, each of a plurality of switches is coupled to a respective one of the plurality of delay cells and configured for activating or deactivating the delay cell based on the register value 220 of the register 254.

As shown in FIG. 2, the circuit 200 in this example further includes a first logic gate 241 that is configured for gating a DCO clock signal DCO_CK2 203 based on a reference signal FREF 202 to generate a step-up signal STPUP 206. To be specific, the first logic gate 241 is a NAND gate having two inputs: the DCO clock signal DCO_CK2 203 and an inverse signal of the FREF 202, i.e. the $\overline{\text{FREF}}$ 205. The $\overline{\text{FREF}}$ 205 is obtained by inverting the reference signal FREF 202 with a first inverter 231. The output of the first logic gate 241 is coupled to a clock input of a first register 251. The first register 251 receives a power supply voltage VDD 204 as a data input, and generates the step-up signal STPUP 206 as a data output. The first register 251 provides the step-up signal STPUP 206 to the multi-bit delay circuit 260 as an input, since the data output of the first register 251 is coupled to a data input of the multi-bit delay circuit 260.

The multi-bit delay circuit 260 in this example receives the step-up signal STPUP 206 as a data input and receives a register value REGO<7:0> 220 from the register 254. A delay resolution setup of the multi-bit delay circuit 260 is configured based on the register value REGO<7:0> 220, such that the multi-bit delay circuit 260 delays the step-up signal STPUP 206 passing through the multi-bit delay circuit 260 by a total delay time and generates a step-down signal STPDN 207 as an output.

As shown in FIG. 2, the circuit 200 in this example further includes a second logic gate 242 that receives the step-up signal STPUP 206 and the step-down signal STPDN 207 as two inputs. To be specific, the second logic gate 242 is a NAND gate whose two inputs are coupled to an output of the multi-bit delay circuit 260 and an output of the first register 251 respectively. The output of the second logic gate 242 is coupled to an input of a second inverter 232 whose output is a pulse signal CNTON 208. The pulse signal CNTON 208 is generated based on the step-up signal STPUP 206 and the step-down signal STPDN 207 and has a pulse width representing the total delay time of the multi-bit delay circuit 260.

As shown in FIG. 2, the circuit 200 in this example further includes a third logic gate 243 that is configured for gating the DCO clock signal DCO_CK2 203 based on the pulse signal CNTON 208 to generate an input to the counter 270. To be specific, the third logic gate 243 is a NAND gate having two inputs: the DCO clock signal DCO_CK2 203 and the pulse signal CNTON 208. The output of the third logic gate 243 is coupled to a clock input of the counter 270. The counter 270 counts rising edges of the DCO clock signal DCO_CK2 203 within a time period of the pulse of the pulse signal CNTON 208. For example, the counter 270 counts two means the pulse of the pulse signal CNTON 208 covers at least one period (including two rising edges) of the DCO clock signal DCO_CK2 203. In another embodiment, the circuit 200 may be modified for the counter 270 to count falling edges of the DCO clock signal DCO_CK2 203 within a time period of the pulse of the pulse signal CNTON 208. The counter 270 outputs a counted value CNTO<7:0> 210.

The DCO clock signal DCO_CK2 203 in this example is generated based on a DCO clock signal DCO_CK 201 and the reference signal FREF 202. As shown in FIG. 2, the circuit 200 in this example further includes a third inverter 233 that inverts the reference signal FREF 202 to generate an inverse signal of the FREF 202, i.e. the $\overline{FREF}$ 205. An output of the third inverter 233 is coupled to a clock input of a second register 252. The second register 252 receives the power supply voltage VDD 204 as a data input, and generates a data output based on the $\overline{FREF}$ 205. The data output of the second register 252 is gating the DCO clock signal DCO_CK 201 via a fourth logic gate 244. To be specific, the fourth logic gate 244 is a NAND gate having two inputs: the DCO clock signal DCO_CK 201 and the data output of the second register 252. The output of the fourth logic gate 244 is coupled to a fourth inverter 234 whose output is the DCO clock signal DCO_CK2 203. This circuit design can ensure that, after all outputs of the circuit 200 are reset, the DCO clock signal DCO_CK2 203 will be effective on the TDC calibration based on the reference signal FREF 202, e.g. starting from a rising edge of the $\overline{FREF}$ 205.

As shown in FIG. 2, the circuit 200 in this example further includes a decision logic circuit 280 coupled to the counter 270. The decision logic circuit 280 in this example includes a fifth inverter 235, a sixth inverter 236, a seventh inverter 237, an eighth inverter 238, a ninth inverter 239, a fifth logic gate 245, a sixth logic gate 246, a seventh logic gate 247, and a third register 253. The fifth logic gate 245 receives the lowest two bits of the output value of the counter 270, i.e. the CNTO<0> 211 and the CNTO<1> 212 of the counted value CNTO<7:0> 210. The fifth logic gate 245 is a NAND gate having two inputs: the CNTO<0> 211 and the CNTO<1> 212. The output of the fifth logic gate 245 is coupled to the fifth inverter 235. The output of the fifth inverter 235 is coupled to a clock input of the third register 253. The third register 253 receives the power supply voltage VDD 204 as a data input, and generates a data output SHEN 214. The data output of the third register 253 is coupled to the sixth inverter 236. The output of the sixth inverter 236 is coupled to the seventh logic gate 247.

The seventh inverter 237 in this example inverts the step-down signal STPDN 207 to provide an input to the sixth logic gate 246. The sixth logic gate 246 is a NAND gate having two inputs: the reference signal FREF 202 and the output of the seventh inverter 237. The output of the sixth logic gate 246 is coupled to the eighth inverter 238. The output of the eighth inverter 238 is coupled to the seventh logic gate 247.

The seventh logic gate 247 in this example is a NAND gate having two inputs: the output of the sixth inverter 236 and the output of the eighth inverter 238. The output of the seventh logic gate 247 is a signal SHENB 215 which serves as an input to the ninth inverter 239. The output of the ninth inverter 239, i.e. the output of the decision logic circuit 280, is a signal SHQ 216 which serves as a clock input of the register 254.

The decision logic circuit 280 in this example is configured for determining whether the counted value CNTO<7:0> 210 is larger than or equal to a threshold to generate a determination result; and providing the determination result to the register 254. In one example, the threshold is two and represents a condition that the total delay time covers at least one period of the DCO clock signal DCO_CK2 203.

The register 254 outputs the register value REGO<7:0> 220 used for controlling the delay resolution of the TDC. In one embodiment, for calibrating the TDC, the register value of the register 254 is initially set for minimum delay resolution of the TDC. That is, the register value REGO<7:0> 220 of the register 254 is initialized to enable the multi-bit delay circuit 260 to have a minimum total delay time.

In addition, based on a comparison output from the decision logic circuit 280 that the total delay time is not larger than one period of the DCO clock signal DCO_CK2 203, the register 254 modifies the register value REGO<7:0> 220 to enable the multi-bit delay circuit 260 to have a larger total delay time. Based on a comparison output from the decision logic circuit 280 that the total delay time is larger than one period of the DCO clock signal DCO_CK2 203, the register 254 fixes the current register value REGO<7:0> 220 to fix the total delay time of the multi-bit delay circuit 260. In this example, the register value REGO<7:0> 220 is fixed as the counted value CNTO<7:0> 210 is equal or more than two.

Further, the register 254 may dynamically and adaptively adjust the register value REGO<7:0> 220 to optimize the total delay time of the multi-bit delay circuit 260, based on a change of TDC conditions like: PVT (process, voltage, temperature) and input frequency. That is, the time resolution of the TDC is adjusted and optimized as DCO frequency or PVT changes.

Figure 3:
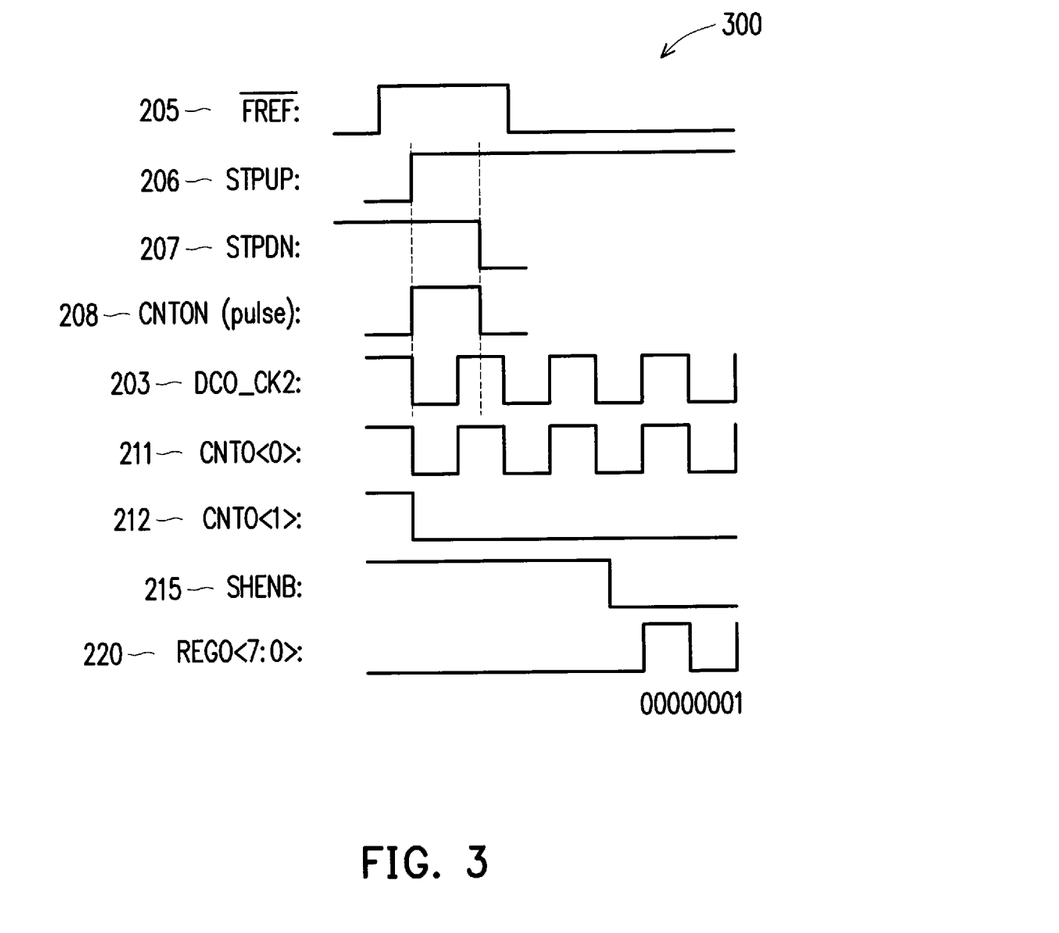
FIG. 3 illustrates waveforms of signals in the circuit shown in FIG. 2, in accordance with some embodiments of the present disclosure.

FIG. 3 illustrates waveforms 300 of signals in an exemplary circuit 200 for calibrating a TDC, in accordance with some embodiments of the present disclosure. In some embodiments, the operations of the circuit 200 when producing the waveforms 300 are performed by the respective components illustrated in FIG. 2. For purposes of discussion, the following embodiment of the waveforms 300 will be described in conjunction with FIG. 2. The illustrated embodiment of the waveforms 300 is merely an example of waveforms at some components of the circuit 200 for calibrating a TDC. Therefore, waveforms from other components or from repeated measurement can be added while remaining within the scope of the present disclosure.

After all outputs of the circuit 200 are reset, the $\overline{\text{FREF}}$ 205 is enabled (i.e., its voltage level is turned high) at the beginning of a calibration or re-calibration. Since the $\overline{\text{FREF}}$ 205 is gating the DCO clock signal DCO_CK2 203 by the NAND gate 241, the DCO clock signal DCO_CK2 203 was not effective to the output of the NAND gate 241 until the $\overline{\text{FREF}}$ 205 is enabled. After the $\overline{\text{FREF}}$ 205 is enabled and turned to logical high, a first falling edge of the DCO clock signal DCO_CK2 203 generates a rising edge at the output of the NAND gate 241 to trigger a clock input to the first register 251. In response to the rising edge clock input, the first register 251 turns the step-up signal STPUP 206 to logical high based on the power supply voltage VDD 204.

After receiving the step-up signal STPUP 206, the multi-bit delay circuit 260 delays to the step-up signal STPUP 206 to generate the step-down signal STPDN 207, whose falling edge happens at a later time than the time when the rising edge of the step-up signal STPUP 206 happened. The second logic gate 242, in conjunction with the second inverter 232 coupled at the output of the second logic gate 242, performs an AND operation on the step-up signal STPUP 206 and the step-down signal STPDN 207 to generate the pulse signal CNTON 208, which includes a pulse having a rising edge same as the rising edge of the step-up signal STPUP 206 and having a falling edge same as the falling edge of the step-down signal STPDN 207.

The third logic gate 243 receives the DCO clock signal DCO_CK2 203 and the pulse signal CNTON 208, and performs an NAND operation on them. When the pulse signal CNTON 208 is at logical low, the DCO clock signal DCO_CK2 203 is not effective to the output of the third logic gate 243. In this case, the output of the third logic gate 243 is kept at logical high, which does not trigger the counter 270 to count rising edges. When the pulse signal CNTON 208 is at logical high within the pulse shown in FIG. 3, the output of the third logic gate 243 will depend on the DCO clock signal DCO_CK2 203. That is, each rising edge of the DCO clock signal DCO_CK2 203 within the pulse of the pulse signal CNTON 208 will be counted by the counter 270. In the embodiment shown in FIG. 3, there is one single rising edge of the DCO clock signal DCO_CK2 203 within the pulse of the pulse signal CNTON 208. As such, the counted value CNTO<7:0> 210 is one in this example. Correspondingly, the CNTO<0> 211 is one; and the CNTO<1> 212 is zero.

The fifth logic gate 245, in conjunction with the fifth inverter 235 coupled at the output of the fifth logic gate 245, performs an AND operation on the CNTO<0> 211 and the CNTO<1> 212 to generate a clock input to the third register 253. In this example, because the CNTO<1> 212 is zero and kept at logical low, the clock input to the third register 253 is logical low, which does not trigger a change of the data output SHEN 214 of the third register 253. As such, the data output SHEN 214 is kept at logical low and the output of the sixth inverter 236 is kept at logical high. Since the one input to the seventh logic gate 247 from the sixth inverter 236 is logical high, the signal SHENB 215 at the output of the seventh logic gate 247 depends merely on the other input to the seventh logic gate 247.

After the seventh inverter 237 inverts the step-down signal STPDN 207 to send an input to the sixth logic gate 246, the sixth logic gate 246, in conjunction with the eighth inverter 238 coupled at the output of the sixth logic gate 246, performs an AND operation on the reference signal FREF 202 and the inverse of the step-down signal STPDN 207 to generate the other input to the seventh logic gate 247. Since both the $\overline{\text{FREF}}$ 205 and the step-down signal STPDN 207 become logical low at some point as shown in FIG. 3, both the reference signal FREF 202 (inverse of the $\overline{\text{FREF}}$ 205) and the inverse of the step-down signal STPDN 207 will become logical high at that point. As such, the other input to the seventh logic gate 247 from the eighth inverter 238 will have a rising edge with a delay time compared to the rising edges of the reference signal FREF 202 and the inverse of the step-down signal STPDN 207. Accordingly, the signal SHENB 215 at the output of the seventh logic gate 247 will have a falling edge with a delay time compared to the rising edges of the reference signal FREF 202 and the inverse of the step-down signal STPDN 207.

The ninth inverter 239 inverts the signal SHENB 215 to generate the signal SHQ 216 having a rising edge, which will trigger the register 254 to change its register value 220 after the signal SHQ 216 is turned to logical high, i.e. after the signal SHENB 215 is turned to logical low. The register value REGO<7:0> 220 in FIG. 3 is set to a minimum value for a minimum delay resolution of the TDC.

Figure 4:
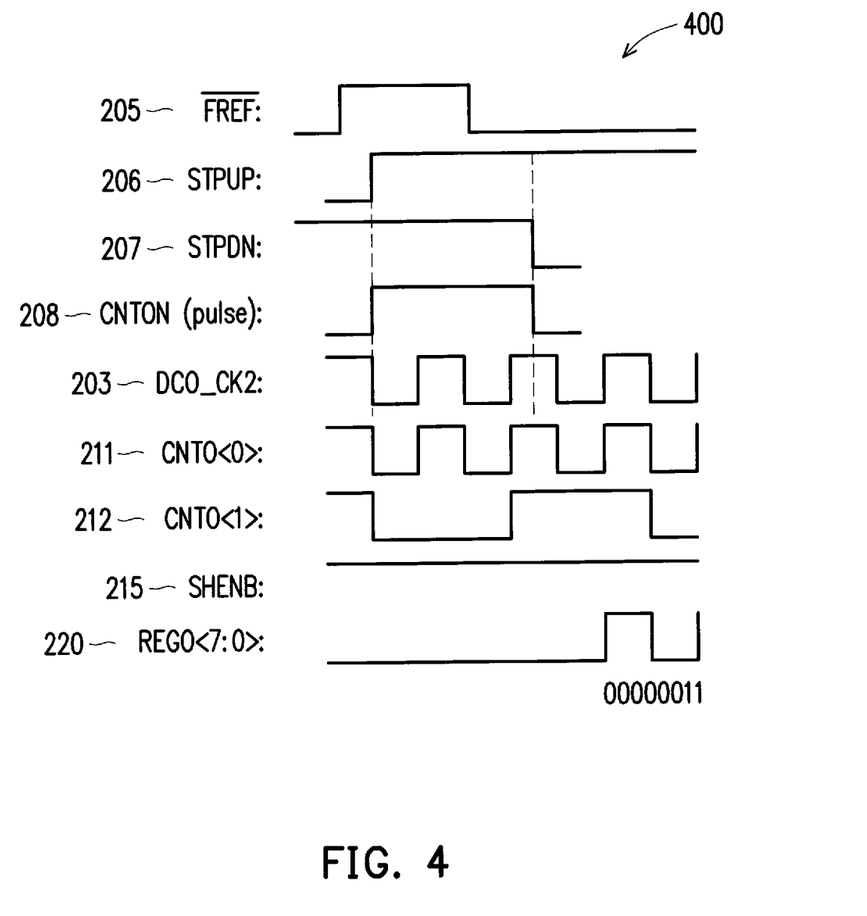
FIG. 4 illustrates waveforms of signals in the circuit shown in FIG. 2, in accordance with other embodiments of the present disclosure.

FIG. 4 illustrates waveforms 400 of signals in an exemplary circuit 200 for calibrating a TDC, in accordance with other embodiments of the present disclosure. In some embodiments, the operations of the circuit 200 when producing the waveforms 400 are performed by the respective components illustrated in FIG. 2. For purposes of discussion, the following embodiment of the waveforms 400 will be described in conjunction with FIG. 2. The illustrated embodiment of the waveforms 400 is merely an example of waveforms at some components of the circuit 200 for calibrating a TDC. Therefore, waveforms from other components or from repeated measurement can be added while remaining within the scope of the present disclosure.

After all outputs of the circuit 200 are reset, the $\overline{\text{FREF}}$ 205 is enabled (i.e., its voltage level is turned high) at the beginning of a calibration or re-calibration. Since the $\overline{\text{FREF}}$ 205 is gating the DCO clock signal DCO_CK2 203 by the NAND gate 241, the DCO clock signal DCO_CK2 203 was not effective to the output of the NAND gate 241 until the $\overline{\text{FREF}}$ 205 is enabled. After the $\overline{\text{FREF}}$ 205 is enabled and turned to logical high, a first falling edge of the DCO clock signal DCO_CK2 203 generates a rising edge at the output of the NAND gate 241 to trigger a clock input to the first register 251. In response to the rising edge clock input, the first register 251 turns the step-up signal STPUP 206 to logical high based on the power supply voltage VDD 204.

After receiving the step-up signal STPUP 206, the multi-bit delay circuit 260 delays to the step-up signal STPUP 206 to generate the step-down signal STPDN 207, whose falling edge happens at a later time than the time when the rising edge of the step-up signal STPUP 206 happened. In this example shown in FIG. 4, the total delay time of the multi-bit delay circuit 260 is larger than the total delay time of the multi-bit delay circuit 260 corresponding to FIG. 3. This is because the register value REGO<7:0> 220 in FIG. 4 has a larger value (00000011) than the value 00000001 of the register value REGO<7:0> 220 in FIG. 3. As such, the falling edge of the step-down signal STPDN 207 in FIG. 4 happens at a later time than the falling edge of the step-down signal STPDN 207 in FIG. 3.

The second logic gate 242, in conjunction with the second inverter 232 coupled at the output of the second logic gate 242, performs an AND operation on the step-up signal STPUP 206 and the step-down signal STPDN 207 to generate the pulse signal CNTON 208, which includes a pulse having a rising edge same as the rising edge of the step-up signal STPUP 206 and having a falling edge same as the falling edge of the step-down signal STPDN 207. The width of the pulse of the pulse signal CNTON 208 in FIG. 4 is larger than the width of the pulse of the pulse signal CNTON 208 in FIG. 3.

The third logic gate 243 receives the DCO clock signal DCO_CK2 203 and the pulse signal CNTON 208, and performs an NAND operation on them. When the pulse signal CNTON 208 is at logical low, the DCO clock signal DCO_CK2 203 is not effective to the output of the third logic gate 243. In this case, the output of the third logic gate 243 is kept at logical high, which does not trigger the counter 270 to count rising edges. When the pulse signal CNTON 208 is at logical high within the pulse shown in FIG. 4, the output of the third logic gate 243 will depend on the DCO clock signal DCO_CK2 203. That is, each rising edge of the DCO clock signal DCO_CK2 203 within the pulse of the pulse signal CNTON 208 in FIG. 4 will be counted by the counter 270. In the embodiment shown in FIG. 4, there are two rising edges of the DCO clock signal DCO_CK2 203 within the pulse of the pulse signal CNTON 208. As such, the counted value CNTO<7:0> 210 is two in this example. Correspondingly, the CNTO<0> 211 is one; and the CNTO<1> 212 is one.

The fifth logic gate 245, in conjunction with the fifth inverter 235 coupled at the output of the fifth logic gate 245, performs an AND operation on the CNTO<0> 211 and the CNTO<1> 212 to generate a clock input to the third register 253. In this example, when the CNTO<1> 212 is at logical low, the clock input to the third register 253 is logical low, which does not trigger a change of the data output SHEN 214 of the third register 253. As such, the data output SHEN 214 is kept at logical low and the output of the sixth inverter 236 is kept at logical high. Since the one input to the seventh logic gate 247 from the sixth inverter 236 is logical high, the signal SHENB 215 at the output of the seventh logic gate 247 depends merely on the other input to the seventh logic gate 247. After the seventh inverter 237 inverts the step-down signal STPDN 207 to send an input to the sixth logic gate 246, the sixth logic gate 246, in conjunction with the eighth inverter 238 coupled at the output of the sixth logic gate 246, performs an AND operation on the reference signal FREF 202 and the inverse of the step-down signal STPDN 207 to generate the other input to the seventh logic gate 247. Since the inverse of the step-down signal STPDN 207 is kept logical low when the CNTO<1> 212 is at (first) logical low as shown in FIG. 4, the other input to the seventh logic gate 247 from the eighth inverter 238 is kept at logical low. Therefore, the signal SHENB 215 at the output of the seventh logic gate 247 is kept at logical high when the CNTO<1> 212 is at logical low.

When the CNTO<1> 212 changes from logical low to logical high with a rising edge, the CNTO<0> 211 also changes from logical low to logical high with a rising edge. As such, the output of the fifth inverter 235 has a rising edge to trigger the clock input to the third register 253, to change the data output SHEN 214 to logical high following the power supply voltage VDD 204. As such, the output of the sixth inverter 236 is changed to logical low. Since the one input to the seventh logic gate 247 from the sixth inverter 236 is logical low, the signal SHENB 215 at the output of the seventh logic gate 247 is at logical high regardless of the value of the other input to the seventh logic gate 247. Therefore, the signal SHENB 215 at the output of the seventh logic gate 247 is still kept at logical high after the CNTO<1> 212 is changed to logical high.

As such, the signal SHENB 215 at the output of the seventh logic gate 247 is kept at logical high as shown in FIG. 4. The ninth inverter 239 inverts the signal SHENB 215 to generate the signal SHQ 216 which is kept at logical low, which will not trigger the register 254 to change its register value 220. This is because in the scenario of FIG. 4, the total delay time, represented by the width of the pulse of the pulse signal CNTON 208, already covers two rising edges of the power supply voltage VDD 204, i.e. covers one period of the DCO clock signal DCO_CK2 203, which means the total delay time is large enough for TDC.

Figure 5:
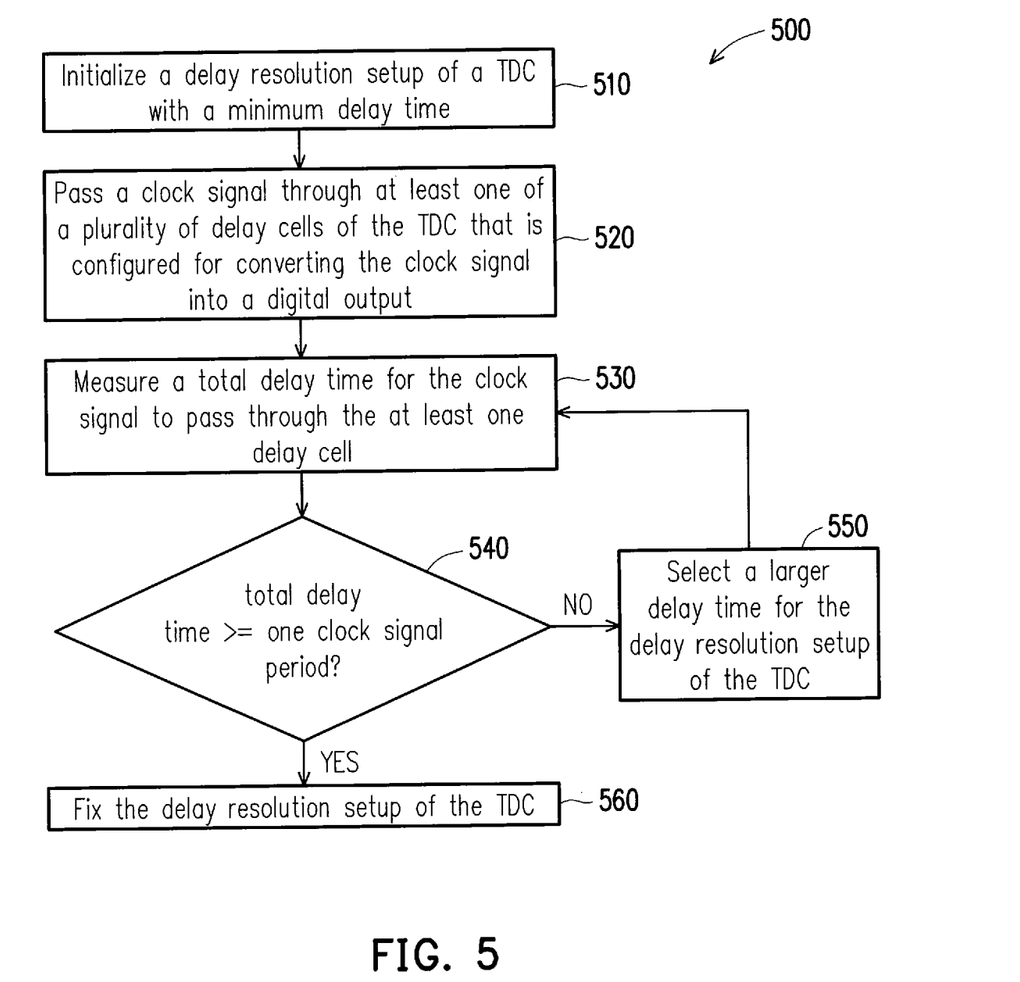
FIG. 5 illustrates a flowchart of a method for calibrating a TDC, in accordance with some embodiments.

FIG. 5 illustrates a flowchart of a method 500 for calibrating a TDC, in accordance with some embodiments. At operation 510, a delay resolution setup of the TDC is initialized with a minimum delay time. At operation 520, a clock signal is passed through at least one of a plurality of delay cells of the TDC that is configured for converting the clock signal into a digital output. For example, the TDC may determine a phase difference between the clock signal and a reference signal. The period of the clock signal is configured by a digitally controlled oscillator (DCO) associated with the TDC. At operation 530, a total delay time is measured for the clock signal to pass through the at least one delay cell. For example, when the TDC has delay cells with 128 stages, after a minimum delay resolution is used initially, a pulse passes the 128 delay cells and the delay time from first to last delay cell outputs is measured.

At operation 540, it is determined that whether the total delay time is larger than or equal to one clock signal period. If so, the process goes to operation 560 to fix the delay resolution setup of the TDC, such that the TDC can return to normal function. If not, the process goes to operation 550 to select a larger delay time for the delay resolution setup of the TDC. For example, a larger delay time may be selected for the delay resolution setup of the TDC by activating one additional delay cell from the plurality of delay cells for the clock signal to pass. The order of the operations shown in FIG. 5 may be changed according to different embodiments of the present disclosure.

The disclosed TDC calibration can be done once initially or dynamically as a detection of changes of input frequency or PVT. In one embodiment, the calibration method includes monitoring the TDC to detect a change of at least one TDC condition selected from the group of: process, voltage, temperature, and input frequency; determining, based on the detected change, that whether the total delay time is larger than one period of the clock signal to generate an updated determination result; and determining whether to re-calibrate the TDC based on the updated determination result. Therefore, the delay resolution may be dynamically optimized based on the disclosed method such that the dynamically optimized delay resolution is much insensitive to PVT and input frequency changes.

In some embodiments, a circuit for calibrating a time to digital converter (TDC) is disclosed. The circuit includes a multi-bit delay circuit, a counter, and a register. The multi-bit delay circuit is configured for delaying a clock signal by a total delay time. The counter is configured for counting rising edges of the clock signal within the total delay time to generate a counted output. The register is configured for controlling the total delay time of the multi-bit delay circuit based on the counted output.

In some embodiments, an apparatus for calibrating a time to digital converter (TDC) is disclosed. The apparatus includes a multi-bit delay circuit, a counter, and a register. The multi-bit delay circuit is configured for delaying a clock signal by a total delay time. The counter is configured for comparing the total delay time with one period of the clock signal to generate a comparison output. The register is configured for controlling the total delay time of the multi-bit delay circuit based on the comparison output.

In some embodiments, a method for calibrating a time to digital converter (TDC) is disclosed. The method includes: passing a first signal through at least one of a plurality of delay cells of the TDC that is configured to determine a phase difference between the first signal and a second signal; measuring a total delay time for the first signal to pass through the at least one delay cell; determining that whether the total delay time is larger than one period of the first signal to generate a determination result; and calibrating the TDC based on the determination result.

While various embodiments of the present disclosure have been described above, it should be understood that they have been presented by way of example only, and not by way of limitation. Likewise, the various diagrams may depict an example architectural or configuration, which are provided to enable persons of ordinary skill in the art to understand exemplary features and functions of the present disclosure. Such persons would understand, however, that the present disclosure is not restricted to the illustrated example architectures or configurations, but can be implemented using a variety of alternative architectures and configurations. Additionally, as would be understood by persons of ordinary skill in the art, one or more features of one embodiment can be combined with one or more features of another embodiment described herein. Thus, the breadth and scope of the present disclosure should not be limited by any of the above-described exemplary embodiments.

It is also understood that any reference to an element herein using a designation such as "first," "second," and so forth does not generally limit the quantity or order of those elements. Rather, these designations are used herein as a convenient means of distinguishing between two or more elements or instances of an element. Thus, a reference to first and second elements does not mean that only two elements can be employed, or that the first element must precede the second element in some manner.

Additionally, a person having ordinary skill in the art would understand that information and signals can be represented using any of a variety of different technologies and techniques. For example, data, instructions, commands, information, signals, bits and symbols, for example, which may be referenced in the above description can be represented by voltages, currents, electromagnetic waves, magnetic fields or particles, optical fields or particles, or any combination thereof.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques.

To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure. In accordance with various embodiments, a processor, device, component, circuit, structure, machine, module, etc. can be configured to perform one or more of the functions described herein. The term "configured to" or "configured for" as used herein with respect to a specified operation or function refers to a processor, device, component, circuit, structure, machine, module, signal, etc. that is physically constructed, programmed, arranged and/or formatted to perform the specified operation or function.

Furthermore, a person of ordinary skill in the art would understand that various illustrative logical blocks, modules, devices, components and circuits described herein can be implemented within or performed by an integrated circuit (IC) that can include a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A processor programmed to perform the functions herein will become a specially programmed, or special-purpose processor, and can be implemented as a combination of computing devices, e.g., a combination of a DSP and a microprocessor, a plurality of microprocessors, one or more microprocessors in conjunction with a DSP core, or any other suitable configuration to perform the functions described herein.

If implemented in software, the functions can be stored as one or more instructions or code on a computer-readable medium. Thus, the steps of a method or algorithm disclosed herein can be implemented as software stored on a computer-readable medium. Computer-readable media includes both computer storage media and communication media including any medium that can be enabled to transfer a computer program or code from one place to another. A storage media can be any available media that can be accessed by a computer. By way of example, and not limitation, such computer-readable media can include RAM, ROM, EEPROM, CD-ROM or other optical disk storage, magnetic disk storage or other magnetic storage devices, or any other medium that can be used to store desired program code in the form of instructions or data structures and that can be accessed by a computer.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the present disclosure.

Various modifications to the implementations described in this disclosure will be readily apparent to those skilled in the art, and the general principles defined herein can be applied to other implementations without departing from the scope of this disclosure. Thus, the disclosure is not intended to be limited to the implementations shown herein, but is to be accorded the widest scope consistent with the novel features and principles disclosed herein, as recited in the claims below.

What is claimed is:

1. A circuit for calibrating a time to digital converter (TDC), comprising:

a multi-bit delay circuit configured for delaying a clock signal by a total delay time;
a counter configured for counting rising edges of the clock signal within the total delay time to generate a counted output; and
a register configured for controlling the total delay time of the multi-bit delay circuit based on the counted output.

2. The circuit of claim 1, wherein the TDC is configured for converting the clock signal into a digital output.

3. The circuit of claim 1, wherein:
the multi-bit delay circuit comprises a plurality of delay cells connected in series to one another; and
the total delay time of the multi-bit delay circuit is variable according to active and inactive delay cells of the plurality of delay cells based on a register value of the register.

4. The circuit of claim 3, further comprising:
a switch that is coupled to the plurality of delay cells and configured for selecting at least one of the plurality of delay cells to activate based on the register value of the register.

5. The circuit of claim 3, further comprising:
a plurality of switches each of which is coupled to a respective one of the plurality of delay cells and configured for activating or deactivating the delay cell based on the register value of the register.

6. The circuit of claim 1, further comprising a decision logic circuit coupled to the counter and configured for:
determining whether the counted output is larger than or equal to a threshold to generate a determination result; and
providing the determination result to the register.

7. The circuit of claim 6, wherein the threshold is two and represents a condition that the total delay time covers at least one period of the clock signal.

8. The circuit of claim 1, further comprising a first logic gate configured for:
gating the clock signal based on a reference signal to generate a step-up signal, wherein the step-up signal is provided to the multi-bit delay circuit as an input.

9. The circuit of claim 8, further comprising a second logic gate configured for:
receiving the step-up signal and a step-down signal that is an output of the multi-bit delay circuit; and
generating a pulse signal based on the step-up signal and the step-down signal, wherein the pulse signal has a pulse width representing the total delay time.

10. The circuit of claim 9, further comprising a third logic gate configured for:
gating the clock signal based on the pulse signal to generate an input to the counter.

11. An apparatus for calibrating a time to digital converter (TDC), comprising:
a multi-bit delay circuit configured for delaying a clock signal by a total delay time;
a counter configured for comparing the total delay time with one period of the clock signal to generate a comparison output; and
a register configured for controlling the total delay time of the multi-bit delay circuit based on the comparison output.

12. The apparatus of claim 11, wherein the register is further configured for:
initializing, for calibrating the TDC, a register value of the register to enable the multi-bit delay circuit to have a minimum total delay time.

13. The apparatus of claim 12, wherein the register is further configured for:
based on a comparison output that the total delay time is not larger than one period of the clock signal, modifying the register value to enable the multi-bit delay circuit to have a larger total delay time; and
based on a comparison output that the total delay time is larger than one period of the clock signal, fixing the register value to fix the total delay time of the multi-bit delay circuit.

14. The apparatus of claim 13, wherein the register is further configured for:
adjusting the register value based on a change of at least one TDC condition.

15. A method for calibrating a time to digital converter (TDC), comprising:
passing a first signal through at least one of a plurality of delay cells of the TDC that is configured to determine a phase difference between the first signal and a second signal;
measuring a total delay time for the first signal to pass through the at least one delay cell;
determining that whether the total delay time is larger than one period of the first signal to generate a determination result; and
calibrating the TDC based on the determination result.

16. The method of claim 15, wherein:
the first signal is a local oscillator clock signal;
the second signal is a frequency reference signal; and
the period of the first signal is configured by a digitally controlled oscillator (DCO) associated with the TDC.

17. The method of claim 15, further comprising:
initializing a delay resolution setup of the TDC with a minimum delay time.

18. The method of claim 17, wherein calibrating the TDC comprises:
based on a determination that the total delay time is not larger than one period of the first signal, selecting a larger delay time for the delay resolution setup of the TDC; and
based on a determination that the total delay time is larger than one period of the first signal, fixing the delay resolution setup of the TDC.

19. The method of claim 18, wherein selecting a larger delay time for the delay resolution setup of the TDC comprises: activating one additional delay cell from the plurality of delay cells for the first signal to pass.

20. The method of claim 15, further comprising:
monitoring the TDC to detect a change of at least one TDC condition;
determining, based on the detected change, that whether the total delay time is larger than one period of the first signal to generate an updated determination result; and
determining whether to re-calibrate the TDC based on the updated determination result.

* * * * *